(12) United States Patent
Ellison

(10) Patent No.: US 6,917,209 B2
(45) Date of Patent: Jul. 12, 2005

(54) NON-CONTACTING CAPACITIVE DIAGNOSTIC DEVICE

(75) Inventor: Timothy Ellison, Brandon Township, Oakland County, MI (US)

(73) Assignee: Energy Conversion Devices, Inc., Rochester Hills, MI (US)

(*) Notice: Subject to any disclaimer, the term of this patent is extended or adjusted under 35 U.S.C. 154(b) by 54 days.

(21) Appl. No.: 09/953,477

(22) Filed: Sep. 15, 2001

(65) Prior Publication Data

US 2003/0059966 A1 Mar. 27, 2003

(51) Int. Cl.$^7$ ............................................. G01R 31/302
(52) U.S. Cl. ........................................ 324/750; 324/752
(58) Field of Search ................................ 324/750–753, 324/765, 71.3, 158.1, 767; 250/305–307, 310–311, 492.1, 492.2; 356/237.2, 237.3, 237.4, 237.5, 369, 447

(56) References Cited

U.S. PATENT DOCUMENTS

| | | | | |
|---|---|---|---|---|
| 4,912,052 A | * | 3/1990 | Miyoshi et al. | 324/751 |
| 4,967,152 A | * | 10/1990 | Patterson | 324/752 |
| 5,087,876 A | * | 2/1992 | Reiss et al. | 324/767 |
| 6,072,320 A | * | 6/2000 | Verkuil | 324/750 |
| 6,184,696 B1 | * | 2/2001 | White et al. | 324/750 |

* cited by examiner

Primary Examiner—Minh N. Tang
(74) Attorney, Agent, or Firm—Kevin L. Bray; Marvin S. Siskind

(57) ABSTRACT

A non-contacting capacitive diagnostic device includes a pulsed light source for producing an electric field in a semiconductor or photovoltaic device or material to be evaluated and a circuit responsive to the electric field. The circuit is not in physical contact with the device or material being evaluated and produces an electrical signal characteristic of the electric field produced in the device or material. The diagnostic device permits quality control and evaluation of semiconductor or photovoltaic device properties in continuous manufacturing processes.

24 Claims, 4 Drawing Sheets

NON-CONTACTING CAPACITIVE DIAGNOSTIC DEVICE

GOVERNMENT INTERESTS

This invention was made with Government support under NREL Subcontract No. ZAX-8-17647-09, prime contract DE-AC36-99GO10337 awarded by the Department of Energy. The Government has certain rights in this invention.

FIELD OF THE INVENTION

The present invention relates generally to a non-contacting device for the diagnostic evaluation of photovoltaic and semiconductor devices and materials. The non-contacting device capacitively senses electric fields produced in the device or material under evaluation by a pulsed light source and produces an electrical signal correlative of the electric field. Parameters related to the properties, performance and operational characteristics of the device or material under evaluation are readily derivable from the electrical signal. Since the non-contacting device requires no physical connection to the device or material under evaluation, its envisioned uses include on-line monitoring, evaluation and quality control of continuous manufacturing processes of photovoltaic and semiconductor devices and materials.

BACKGROUND OF THE INVENTION

Solar energy is becoming an increasingly feasible alternative to conventional fossil fuels for many applications. Efficient extraction of energy from the sun requires photovoltaic materials and devices capable of efficiently converting the energy contained in sunlight to electricity. The most common photovoltaic materials are semiconductors that convert sunlight to electricity by absorbing sunlight through a valence band to conduction band transition to produce the mobile charge carriers (electrons and holes) necessary to produce electrical current or voltage. Successful photovoltaic materials necessarily must possess high absorption efficiency over as much of the solar spectrum as possible and provide high mobility for the photo-generated charge carriers.

Most current photovoltaic devices are based on silicon. Silicon is a well-known electronic material and forms the basis for most modem semiconductor devices. As a photovoltaic material for solar energy devices, silicon provides high mobilities for charge carriers and readily permits integration of solar energy devices with other electronic devices. The absorption efficiency of silicon depends on its form. Crystalline silicon is an indirect bandgap semiconductor and has an intrinsically low absorption efficiency. Consequently, photovoltaic devices made from crystalline silicon are necessarily thick. Amorphous silicon, on the contrary, is a direct bandgap semiconductor and has a high absorption efficiency. The high absorption efficiency of amorphous silicon means that it can be used in thin film form in photovoltaic devices. From a processing point of view, amorphous silicon is preferable to crystalline silicon because it can readily be produced in a continuous manner over large areas in thin film form. Crystalline silicon, on the contrary, requires careful preparation in batch quantities through a slow, equilibrium growth process. As a result of the more convenient processing conditions and need for smaller quantities of material, amorphous silicon has emerged as the leading material for practical photovoltaic applications.

The economic viability of photovoltaic devices based on amorphous silicon depends critically on the ability to produce it in a high speed, continuous manufacturing process. The manufacturing process must permit the deposition of amorphous silicon over large area substrates in a wide variety of device configurations. One common device structure is the p-i-n structure. In this structure, three layers of amorphous silicon are present: an n-type layer, an intrinsic or undoped layer, and a p-type layer. Tandem device structures comprising a plurality of p-i-n structures are also common. The triple junction cell, for example, includes three stacked p-i-n structures, each of which is designed to absorb a different portion of the incident or solar spectrum. Optimal performance of layered amorphous silicon based photovoltaic devices requires stringent control over the thickness and chemical composition of the layers during manufacturing. Even small deviations from the intended specifications can significantly detract from device performance. Analogous considerations apply to related thin film photovoltaic materials such as germanium or alloys of amorphous silicon with germanium non-silicon based thin films, or even thicker crystalline or polycrystalline devices.

Consequently, a need exists for precise quality control during the high speed manufacturing of photovoltaic devices comprised of thin film layers. The most effective high-speed manufacturing processes are web based deposition processes. In these processes, deposition of layers of thin film photovoltaic materials to form a device occurs onto a moving web of a substrate material such as stainless steel. The web is fed from a source roll into a deposition chamber and is collected by a take-up roll after deposition of the desired combination of thin film layers. Web lengths of hundreds to many thousand feet can be used. Current quality control methods emphasize evaluating material properties and device performance after take-up has occurred. Typical post-deposition quality control methods involve removing the web or portions thereof from the take-up roll and depositing a conducting material such as ITO on the last deposited layer of a photovoltaic structure as a prerequisite to testing. The conducting material represents a physical electrical contact to the photovoltaic structure and permits measurement of relevant performance parameters such as open circuit voltages, short circuit currents, fill factor, shunt resistance and series resistance through a quality control device or method.

Although the post-processing, contacting quality control devices and methods of the prior art are capable of providing the relevant information needed to evaluate the performance and properties of photovoltaic devices, they suffer from an important disadvantage in that they offer slow information feedback rates. Web processing times are typically on the order of a day and it typically takes another few days to deposit the contacting conductive layer needed to perform quality control measurements. Consequently, quality control information is only available several days after culmination of the processing of the web. The long feedback time means that any problem that develops during processing is not known for days and that several days worth of material processed subsequent to the onset of the problem is potentially defective. Once a problem is detected, more production time is lost to relating the problem to process variables and to producing new material to verify that the problem has been properly remedied. The production of substantial amounts of defective product and the loss of valuable production time are costly and negatively impact the economic feasibility of photovoltaic and solar energy materials.

The present invention addresses the need for more immediate quality control assessment during the manufacture of photovoltaic devices. It is desirable to have a diagnostic quality control device or process for the manufacture of photovoltaic devices that provides a high information feedback rate and that permits on-line correction and optimization of the manufacturing process. The most common prior art quality control devices and processes are limited primarily by the need to form physical electrical contacts to the photovoltaic material or device being evaluated. Since this need cannot currently be met in a continuous manufacturing environment, prior art quality control is performed post-processing on a stationary web or portion thereof. The present invention describes a diagnostic device and process for quality control and evaluation that does not require the establishment of physical electrical contacts to the photovoltaic device being evaluated. The non-contacting diagnostic device and method of the present invention provides for the real-time evaluation of performance parameters of photovoltaic devices in a continuous manufacturing process.

SUMMARY OF THE INVENTION

Disclosed herein is a diagnostic device for evaluating the properties, performance parameters and operational characteristics of semiconductor and photovoltaic devices and materials. The diagnostic device includes a pulsed light source for producing an electric field or voltage in the device or material under evaluation and a circuit for sensing the electric field. The electric field is generated upon absorption of the pulsed light to form charge carriers and is characteristic of the properties and characteristics of the device or material under evaluation. The circuit used for sensing the electric field is not in physical contact with the device or material under evaluation.

DETAILED DESCRIPTION OF THE INVENTION

Figure 1:
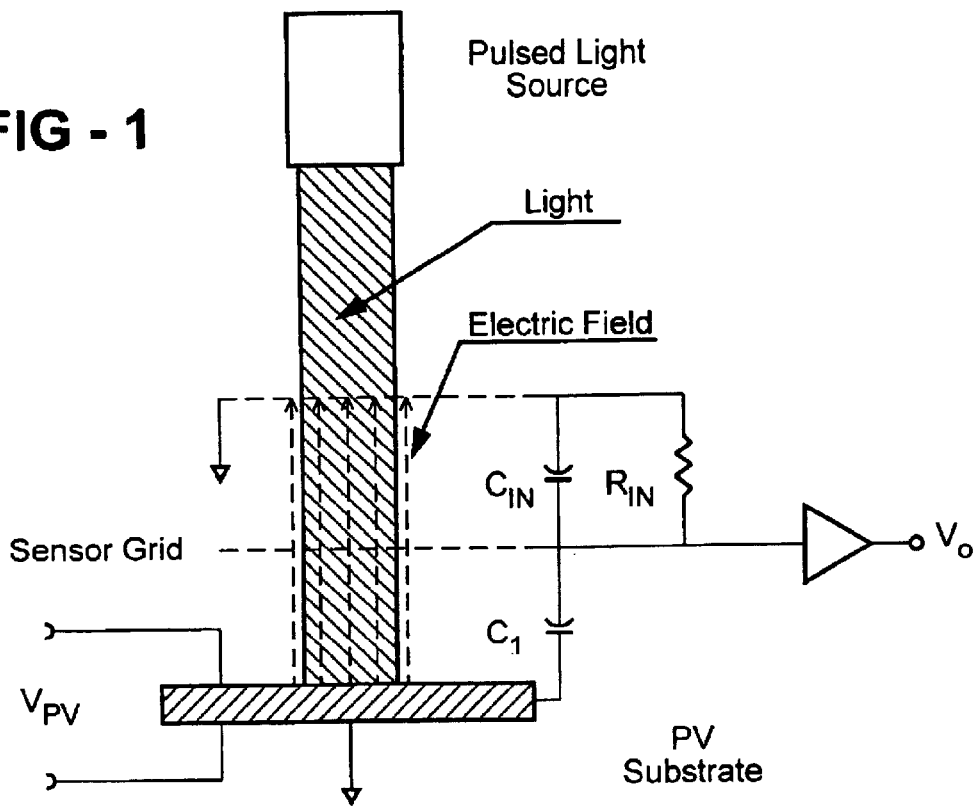
FIG. 1 is a schematic depiction of one embodiment of the diagnostic device of the present invention.

The present invention describes a diagnostic device and process for quality control, evaluation and property measurements of semiconductor or photovoltaic devices or materials. Since the diagnostic device and process of the present invention do not require the formation of physical electrical contacts to the photovoltaic device under evaluation, they are hereafter referred to as non-contacting. The non-contacting nature of the diagnostic device of the present invention means that measurement of performance parameters for photovoltaic devices can be completed remotely and without a physical connection between the diagnostic device and the photovoltaic device being evaluated. As a result, physical separation of the diagnostic device of the present invention and the photovoltaic device being evaluated is possible. It is this physical separation that renders the diagnostic device of the present invention suitable for the evaluation of the performance parameters of photovoltaic devices in a continuous manufacturing process.

The diagnostic device of the present invention combines a pulsed light source for exciting the photovoltaic device under evaluation and a circuit for detecting electrical effects induced in the photovoltaic device by the pulsed light source. The purpose of the pulsed light source is to excite an electron from the valence band to the conduction band of a semiconductor layer in a photovoltaic device structure. Consequently, the pulsed light source provides photons with an energy at or above the bandgap energy of at least one semiconductor layer contained in a photovoltaic device. Excitation of electrons from the valence band to the conduction band leads to the formation of two types of mobile electrical charge carriers: negatively charged electrons in the conduction band and positively charged holes in the valence band. The electrons and holes are spatially separated from each other and this separation of electric charge leads to the creation of an electric field in and in the vicinity of the photovoltaic device or material. The electric field within the photovoltaic device or material produces a voltage that is characteristic of the performance and operational properties of the photovoltaic device.

By measuring the electric field or voltage (or some quantity readily related thereto) produced by the pulsed light source in the photovoltaic device, quality control and performance evaluation of the photovoltaic device can be completed. The most common way for measuring the electric field or voltage according to the prior art is to first establish a physical electrical contact with the photovoltaic device under evaluation and then to make a measurement using a standard electrical technique or instrument such as a voltmeter or oscilloscope. In the present invention, the electric field or voltage is measured without making a physical electrical contact to the photovoltaic device. Instead, a sensing circuit located proximate to, but not in physical contact with, the photovoltaic device is used to detect the electric field produced by the pulsed light source. The sensing circuit includes a receiving element that is responsive to the electric field. The receiving element responds to the electric field by developing a charge, voltage, current or other electrical effect that is proportional to or otherwise characteristic of the electric field. This response of the receiving element can be directly used to evaluate properties of the photovoltaic device or material or can be used as an intermediate signal and provided to a detection circuit in electrical communication with the receiving element to provide an output signal that is proportional or otherwise characteristic of the electric field. The output signal can be a voltage, resistance, current, charge or other electrical effect. The receiving element may be an electrode, conductive material or other material capable of developing charge, current or other electrical effect in the presence of an electric field.

Even though the sensing circuit is not in physical contact with the photovoltaic device under evaluation, it is capacitively responsive to the electric field produced by the pulsed light source. The spatial gap between the photovoltaic device and receiving element of the sensing circuit possesses a dielectric capacitance that is characteristic of the composition of the material present in the gap (e.g. air) and its thickness. Consequently, the dielectric material present in the gap and the two surrounding surfaces, one from the receiving element and one from the photovoltaic device under evaluation, form a dielectric capacitor. The non-contacting diagnostic capability of the present invention originates from this dielectric capacitor.

Under suitable conditions, a current can be induced in the receiving element through the dielectric material by an electric field in the photovoltaic material or device under evaluation. According to standard theories of dielectric capacitors, a voltage or a current (depending upon whether one connects to the receiving element with a high or low impedance detection circuit) will be induced in the sensing electrode whenever the voltage difference between the photovoltaic material and the sensing electrode varies in time. The magnitude of the induced current or voltage is given by or proportional to the product of the capacitance of the dielectric material in the gap and the time rate of change of the voltage difference. Equivalently, a current will be induced in the sensing electrode when the electric field it experiences varies in time. When the receiving element experiences a constant electric field, it develops a constant electrical charge. Since the charge is constant, no current develops because a requirement for current is a time-varying electrical charge. In the presence of a time-varying electric field, however, the receiving element develops an electrical charge that varies in time and hence it develops a current.

The current produced in the receiving element can be measured or used as an intermediate signal for introduction to a detection circuit for further processing to produce an output signal which can be, for example, a voltage, resistance, current, other electrical effect or amplified forms thereof. In some embodiments, the detection circuit can suppress the flow of current from the receiving element and a charge develops on the receiving element. Since the charge is characteristic of the electric field produced by the pulsed light source, it can be used as a diagnostic of the semiconductor or photovoltaic device or material being evaluated.

In one embodiment, the diagnostic device of the present invention is designed to meet the time-varying voltage and electric field requirements necessary to induce a current in the receiving element of the sensing circuit. The pulsed light source induces a time dependent electric field and a time dependent voltage in the photovoltaic device under evaluation. The magnitude of the current induced in the receiving element depends on the magnitude and time variation of the electric field it experiences and on the composition and thickness of the dielectric material in the spatial gap separating the receiving element from the photovoltaic device under evaluation. The electric field experienced by the receiving element is determined by the intensity and pulse characteristics (e.g. pulse duration and repetition rate) of the light source and the intrinsic electrical properties of the photovoltaic material under evaluation. The dielectric material present in the spatial gap is determined by the laboratory or processing environment in which the photovoltaic device is being evaluated and the thickness of the spatial gap corresponds to the distance between the receiving element and photovoltaic device under evaluation.

During operation of the diagnostic device in this embodiment, all operational parameters deterministic of the current induced in the receiving element are known and held constant except for the properties of the photovoltaic device under evaluation. Hence, the magnitude of the induced current is characteristic of the properties of the photovoltaic device and measurement of the current provides a diagnostic of the photovoltaic device. Since the current is measured at the receiving element, or with a detection circuit in electrical communication with the sensing electrode, the measurement is non-contacting. The capacitive nature of the current induced in the receiving element obviates the need to establish a physical electrical contact between the diagnostic device of the present invention and the photovoltaic device under evaluation. The diagnostic device is in capacitive communication with the photovoltaic device under evaluation and receives as input a capacitively induced current characteristic of the photovoltaic device under evaluation.

The current per se induced in the receiving element need not be the diagnostic quantity used to measure the properties of the photovoltaic device under evaluation. Any quantity or electrical effect readily related to, derived from or induced by the current can also serve as a diagnostic (for example, voltage, resistance, inductance). Convenience, stability and accuracy of a detection circuit connected to the receiving element govern the selection of a diagnostic quantity. In one embodiment of the present invention, the current induced in the receiving element is converted to a voltage by a detection circuit connected to the receiving element. If all operational parameters deterministic of the induced current are fixed, the voltage converted from the induced current is proportional to the voltage induced by the pulsed light source in the photovoltaic material under evaluation.

In other embodiments of the present invention, the detection circuit can inhibit the flow of the current that develops on the receiving element thereby leading to an accumulation of charge on the receiving element. Measurement of this charge, or a quantity correlative of this charge, provides a diagnostic that is directly proportional to or otherwise characteristic of the electric field produced in the photovoltaic device or material by the pulsed light source.

Referring now to FIG. 1, there is shown a schematic of one embodiment of the present invention. The PV substrate depicts the photovoltaic device or material under evaluation. The PV substrate could be stationary or could represent a portion of a moving web. The remainder of FIG. 1 depicts one embodiment of the diagnostic device of the present invention. The embodiment comprises a pulsed light source, a sensing electrode which functions as a receiving element, a grounded electrode and circuitry for converting the current induced in the sensing electrode into an output voltage $V_O$ that is proportional to the voltage $V_{PV}$ produced in the photovoltaic device by the pulsed light source. In this embodiment, the grounded electrode and converting circuitry constitute one example of a detection circuit. Since the light source is pulsed, the voltages $V_O$ and $V_{PV}$ are time dependent. In the embodiment shown in FIG. 1, the sensing electrode and grounded electrode are transparent and the diagnostic device functions by pulsing the light source through the two electrodes to excite the photovoltaic device. The voltage $V_{PV}$ produced in the photovoltaic device varies in time according to the pulse duration, intensity, and repetition rate of the pulsed light source and is further influenced by the temporal characteristics of charge carriers in the photovoltaic device. The sensing electrode is in capacitive communication with the photovoltaic device with the capacitance labeled $C_1$ in FIG. 1. The capacitance $C_1$ depends on the dielectric material between the sensing electrode and the photovoltaic device and varies inversely with the distance between the sensing electrode and photovoltaic device. $C_1$ typically has a value between about 1 and 10 pF.

The time-varying electric field produced in the photovoltaic device by the pulsed light source induces a current in the sensing electrode. In the embodiment shown in FIG. 1, this current is directed to a detection circuit that converts it to a voltage and amplifies it. The grounded electrode acts to ground the detection circuit and is connected to the negative terminal of the amplifier. The sensing electrode is connected to the positive terminal of the amplifier. $C_{IN}$ represents the capacitance between the sensing electrode and grounded electrode and is due primarily to the input capacitance of the amplifier and the capacitance of the cable connecting the sensing electrode to the amplifier. The input resistance $R_{IN}$ is in parallel with the input capacitance $C_{IN}$. The combination of $C_{IN}$ and $R_{IN}$ converts the current induced in the sensing electrode into a voltage $V_1$ relative to the grounded electrode. The amplifier amplifies this voltage to produce an output voltage $V_0$ that is proportional to $V_{PV}$. Typical values for $C_{IN}$ and $R_{IN}$ range from about 10–50 pF and 0.1–1 TΩ, respectively. Alternately, one could use amplifiers with much lower input impedances, or even amplifiers which put the receiving element at a virtual ground. In this case, the output signal may be differentiated and later integrated with hardware or software, or a low impedance charge amplifier (integrating circuit) can be used.

The circuit elements $C_1$, $C_{IN}$, and $R_{IN}$ as shown in FIG. 1 represent an example of a high input impedance voltage dividing circuit. When the pulse duration of the pulsed light source is much shorter than the time response $R_{IN}C_{IN}$ of the voltage dividing circuit, standard theories of electrical circuits indicate that the voltage difference $V_1$ between the sensing electrode and grounded electrode is related to the voltage $V_{PV}$ produced in the photovoltaic device under evaluation through $$V_1 = V_{PV} \frac{C_1}{C_1 + C_{IN}} \approx V_{PV} \frac{C_1}{C_{IN}} \quad (1)$$

where the approximation is valid when $C_{IN}$ is much larger than $C_1$. The output voltage $V_0$ is obtained by multiplying $V_1$ by the gain factor of the amplifier.

Figure 2:
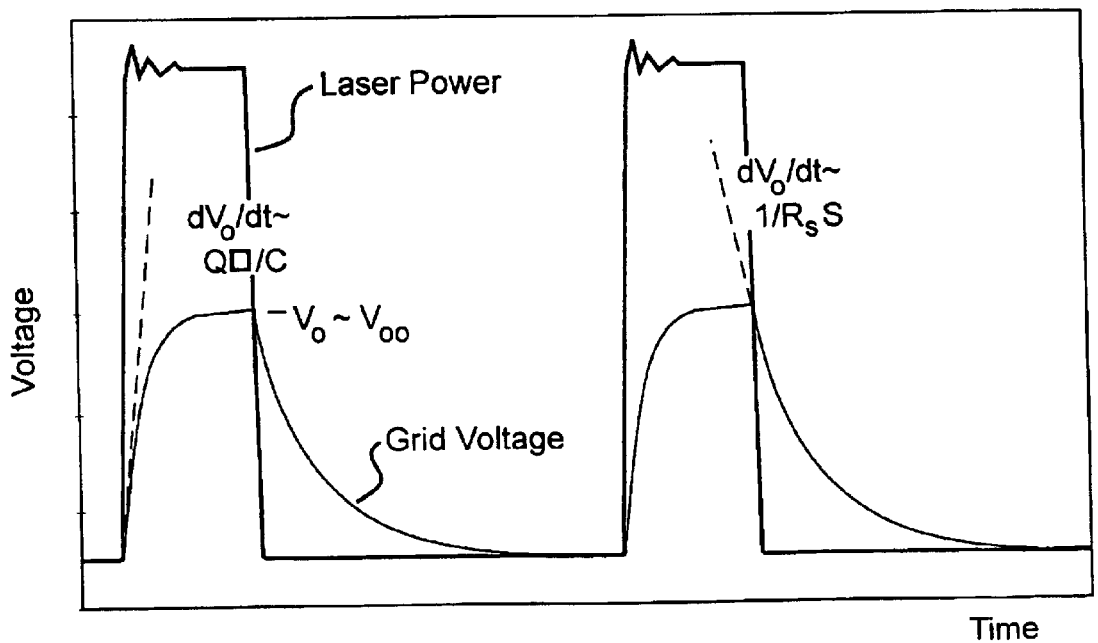
FIG. 2 is a schematic depiction of the waveform for the output voltage $V_O$ of the diagnostic device shown schematically in FIG. 1 herein under square wave excitation.

The time evolution of the output voltage $V_0$ provides diagnostic information about the photovoltaic device under evaluation. Typical waveforms for the time variation of $V_0$ under pulsed square wave excitation are shown in FIG. 2. The thick solid line depicts waveforms for the voltage and the thin solid line depicts waveforms of the light source. The voltage waveform is representative of the output voltage expected from the embodiment shown in FIG. 1 under a pulsed square wave excitation. Before the light source is turned on, the output voltage $V_0$ is constant and at its baseline value. At this point, the output voltage $V_0$ contains no contribution from the photovoltaic device under evaluation and nominally has a value of zero. In practice, stray or background voltages may be present to produce a non-zero baseline voltage. If a non-zero baseline voltage is present, it can readily be subtracted to obtain voltage effects associated with the photovoltaic device under evaluation. For the purposes of the following discussion, it will be assumed that subtraction of any baseline voltage has occurred and that any non-zero output voltage $V_0$ is due to effects occurring within the photovoltaic device under evaluation. There may also be a baseline voltage on the photovoltaic device or material under evaluation itself which cannot be sensed by the ac-coupled diagnostic device. Such a baseline voltage could be measured separately by a Kelvin probe, or by using a grounded shutter in the present invention. Alternatively, the baseline voltage may be removed, for example, by heating the photovoltaic material or device under evaluation or by using a UV light source.

When the light source is turned on, excitation of the photovoltaic device occurs. The resulting separation of electrical charges leads to the development of a voltage $V_{PV}$ in the photovoltaic device and a proportional output voltage $V_0$ from the diagnostic device. The output voltage $V_0$ does not instantaneously achieve its maximum value, but rather increases gradually with a risetime that is characteristic of the performance of the photovoltaic device. Upon exposure to the light source for a sufficiently long period of time, the output voltage $V_0$ levels off, achieves a plateau value and holds this value until the light source is turned off. When the light source is turned off, the photovoltaic device is no longer being excited. At the instant the light source is turned off, the photovoltaic device is still in an excited state. This state gradually decays with a falltime characteristic of the performance of the photovoltaic device. Eventually, the photovoltaic device relaxes back to its initial unexcited state and the output voltage $V_0$ returns to zero. This waveform for $V_0$ is repeated for each successive excitation by the pulsed light source.

Analysis of the risetime, plateau value and falltime portions of the output voltage waveform provides information about the performance of the photovoltaic device. Further information can be gained by measuring these properties with pulsed light having different intensities or a different wavelength spectrum. When using a calibrated light source with a known photon flux (intensity) Ψ, the short circuit current $J_{sc}$, capacitance c, open circuit voltage $V_{oc}$, and shunt and series resistances $R_{sh}$ and $R_s$ of the photovoltaic device under evaluation can be obtained by considering the different time regimes represented by the waveform of the output voltage $V_0(t)$. In the regime shortly after the light source is turned on, where the output voltage $V_0(t)$ is much smaller than its maximum value, the rate of change of the output voltage with respect to time is proportional to the ratio of the short circuit current $J_{sc}$ to the capacitance c of the photovoltaic device or material being evaluated. The rate of change of the output voltage in the short time regime is given by the initial slope of the waveform of the output voltage $V_0$ and is schematically illustrated with the dashed line shown on the left side of FIG. 2. The initial slope can be readily determined from the waveform.

As another example, in the regime where the output voltage $V_0$ has leveled, the plateau value of $V_0$ can be used to obtain the open circuit voltage $V_{oc}$. The plateau value of $V_0$ is first divided by the gain factor of the amplifier to obtain the corresponding value of the voltage difference $V_1$ between the sensing electrode and grounded electrode. The corresponding value of $V_{PV}$ is obtained from this value of $V_1$ through the voltage divider equation presented hereinabove as Equation (1). The resulting value of $V_{PV}$ corresponds to the open circuit voltage $V_{oc}$ because it represents the device voltage without any external DC load.

When the light source is turned off, the rate of change of the output voltage $V_0$ with time is inversely proportional to the product of the capacitance c and shunt resistance $R_s$. The time rate of change of the output voltage after turning the light pulse off is schematically illustrated with the dashed line shown on the right side of FIG. 2 and can be readily determined from the waveform.

As another example, one can measure the open circuit voltage as function of the light intensity. From these measurements one can obtain the diode junction V/I curve, wherein the voltage increases with the logarithm of the current or light intensity. In the case where there is a non negligible shunt resistance, the shunt resistance can also be measured (e.g., in an extreme condition, where the shunt resistance is determining the PV voltage, we observe a linear V/I relationship rather than a logarithmic relationship).

The present inventors have completed several tests and experiments to demonstrate the accuracy and effectiveness of the diagnostic device of the present invention. The results and interpretation of these experiments are described hereinbelow.

EXPERIMENT 1

Figure 3:
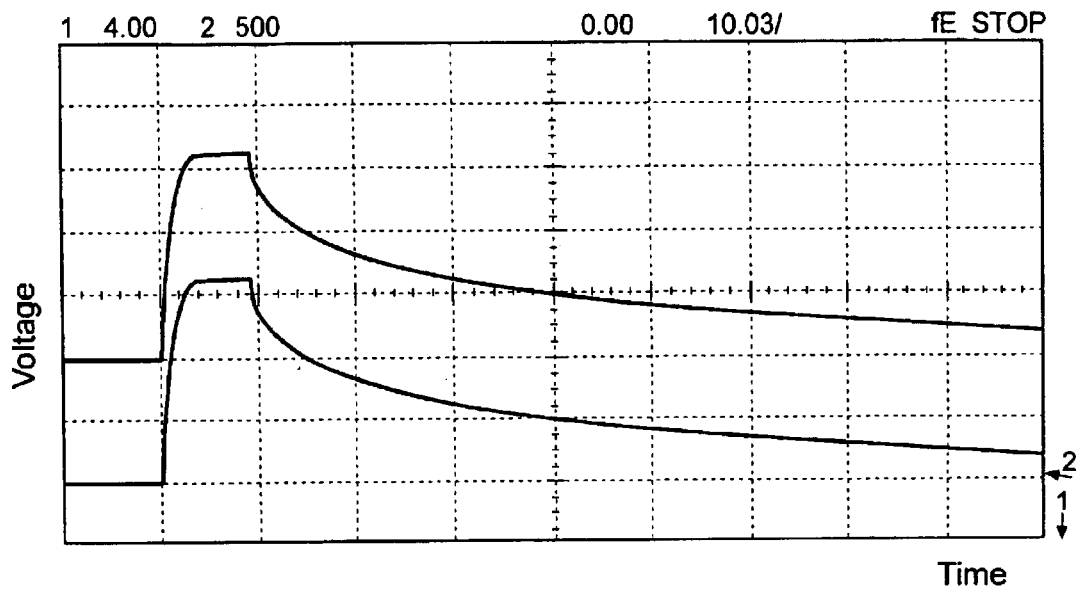
FIG. 3 is a depiction of measured voltage waveforms using an embodiment of the non-contacting diagnostic device of the present invention and a contacting device of the prior art.

The purpose of this experiment is to compare the performance of the non-contacting diagnostic device of the present invention with a contacting device based on the prior art. FIG. 3 shows a comparison of the waveform of the output voltage $V_O$ from the non-contacting photovoltaic capacitive diagnostic device of the present invention with the corresponding waveform obtained by a contacting device according to the prior art. The two waveforms were measured simultaneously on a stationary photovoltaic device that included a transparent conducting indium tin oxide (ITO) coating on top to permit electrical measurements to be made using the contacting device of the prior art. The waveform of the non-contacting diagnostic device of the present invention was obtained using the embodiment shown in FIG. 1 in which $R_{IN}$=200 GΩ, $C_{IN}$=10 pF, $C_1$=1 pF, the amplifier gain factor was 20 and an infrared pulsed diode laser light source with a pulse duration of 10 ms was used. The photovoltaic device being evaluated was a triple cell device. The waveform from the contacting method of the prior art was obtained by making physical electrical contacts to the ITO top layer of the photovoltaic device being evaluated. A probe connected to a high input impedance (100 MΩ) oscilloscope was used.

In the waveforms shown in FIG. 3, the output voltage as a function of time is plotted for one light pulse. Graticule lines divide the horizontal (time) axis into divisions of 10 ms and the vertical axis depicts relative or proportional voltage. The upper waveform was obtained from the non-contacting diagnostic device of the present invention and the lower waveform was obtained simultaneously from the contacting device of the prior art. The two waveforms have been arbitrarily offset by a constant factor for the purposes of comparison. The light source was turned on at the second graticule line and turned off at the third graticule line of the time axis. The intrinsic turn on and turn off times of the light source were much shorter than the risetime and falltime of the photovoltaic device under evaluation in order to realize to a close approximation a square wave excitation pulse profile of the type shown in FIG. 2. The excitation pulse has a duration of 10 ms and a single repetition.

A comparison of the two waveforms indicates that the waveform obtained from the non-contacting device of the present invention is substantially identical to the waveform obtained from the contacting device of the prior art. Analysis of the two waveforms to obtain performance parameters for the photovoltaic device will therefore lead to substantially identical results for the two devices. This experiment demonstrates that the non-contacting diagnostic device of the present invention is substantially as accurate as the contacting device of the prior art for assessing the properties of photovoltaic devices.

EXPERIMENT 2

The purpose of this experiment is to show that the initial time rate of change of the output voltage is proportional to the short circuit current $J_{sc}$ of the photovoltaic device under evaluation. In this experiment, the non-contacting diagnostic device and square wave excitation pulse described in EXPERIMENT 1 hereinabove were used. The photovoltaic device being evaluated was a single junction bottom cell device. The rationale for this experiment is based on the following relationship between the short circuit current $J_{sc}$ and the intensity $\Psi$ of the light source:

$$J_{sc} = \Psi Q e \qquad (3)$$

where Q represents the quantum efficiency of the photovoltaic device under evaluation, and e represents the fundamental electron charge. Since e is a fundamental constant and Q is constant for a particular photovoltaic device, Eq. (3) shows that the short circuit current $J_{sc}$ is proportional to the intensity of the light source for a given photovoltaic device. Consequently, establishment of a proportionality between the initial time rate of change of the output voltage $V_O$ and the light source intensity demonstrates that the short circuit current $J_{sc}$ is proportional to the initial time rate of change of the output voltage $V_O$.

Figure 4:
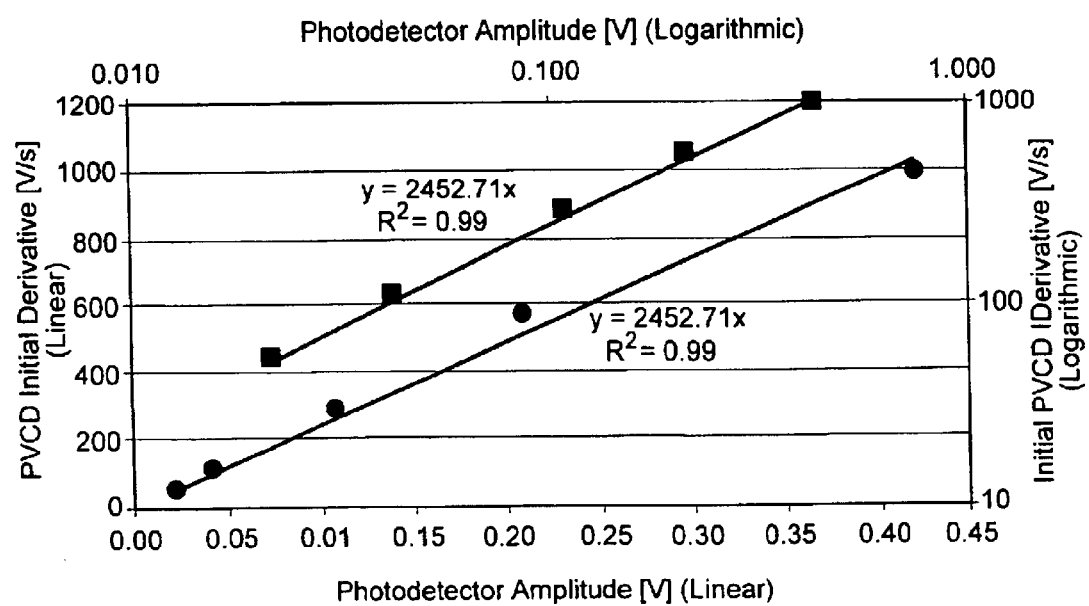
FIG. 4 is a plot of the initial derivative of the voltage waveform as a function of photodetector amplitude in linear and logarithmic coordinate scales for a representative photovoltaic device obtained from measurements performed by one embodiment of the non-contacting diagnostic device of the present invention.

The results of the experiment are summarized in FIG. 4, which shows a plot of the initial time rate of change of $V_O$ as a function of the intensity of the square wave excitation pulse in linear and logarithmic coordinates. The initial time rate of change of $V_O$ is given by the vertical axis and is labeled "PVCD Initial Derivative" where PVCD stands for photovoltaic capacitive diagnostic in reference to the non-contacting device of the present invention. The light source intensity is given by the horizontal axis and is labeled "Photodetector Amplitude" to reflect the fact that the intensity was measured with a photodetector. The photodetector amplitude is directly proportional to the light source intensity. In the experiment, the intensity of the light source was systematically varied and for each intensity of light source used, a waveform of the type shown in FIG. 3 was measured. An initial time rate of change of $V_O$ was obtained from each waveform and this time rate of change was plotted as a function of light source intensity in FIG. 4.

FIG. 4 indicates that the initial time rate of change of $V_O$ is directly proportional to the light source intensity. Consequently, this experiment shows that the initial time rate of change of $V_O$ is proportional to the short circuit current $J_{sc}$.

EXPERIMENT 3

The purpose of this experiment is to determine the current-voltage relationship and fill factor of a photovoltaic device using the non-contacting diagnostic device of the present invention. In this experiment, the non-contacting diagnostic device, photovoltaic device and square wave excitation pulse described in EXPERIMENT 2 hereinabove were used.

A method for determining a relationship that corresponds to the current-voltage relationship of a photovoltaic device junction is to vary the intensity of the light source and measure the plateau value of the output voltage $V_O$ (rather than the initial derivative, or slope, as in the above example) as a function of light source intensity. The basis of this approach is that the plateau value of the output voltage $V_O$ is proportional to the steady state value of the photovoltaic device voltage $V_{PV}$ for the particular light source intensity used to excite the device. Since the light source intensity is proportional to current, variation of light source intensity is tantamount to varying current. Consequently, a plot of the plateau value of the output voltage $V_O$ as a function of light intensity can be used to obtain the current-voltage relationship for the photovoltaic device under evaluation.

Figure 5:
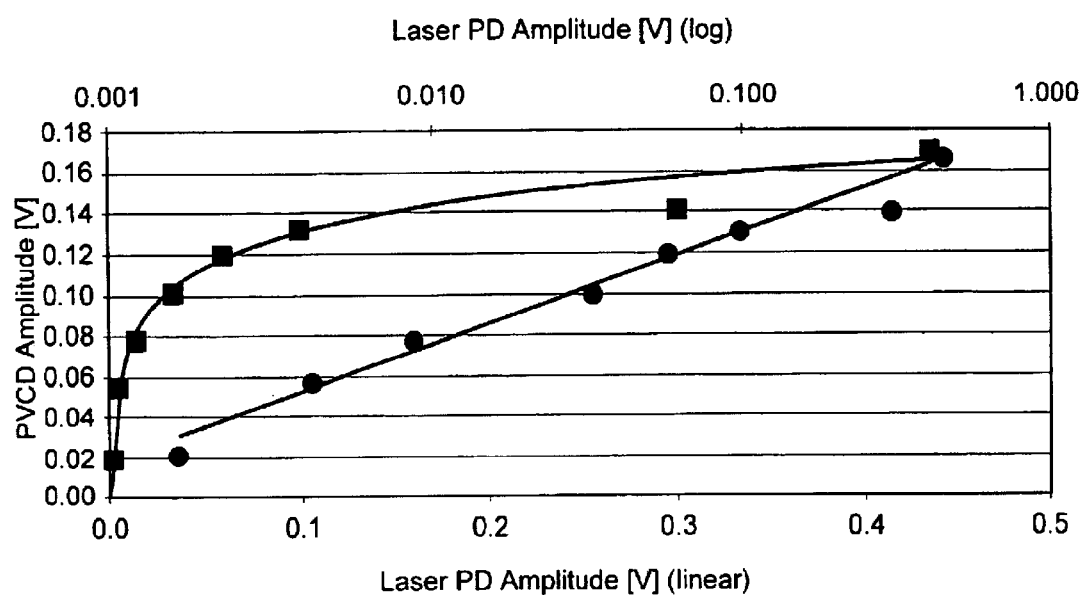
FIG. 5 is a plot of the plateau value of the voltage waveform as a function of photodetector amplitude in linear and logarithmic coordinate scales for a representative photovoltaic device obtained from measurements performed by one embodiment of the non-contacting diagnostic device of the present invention.
Figure 6:
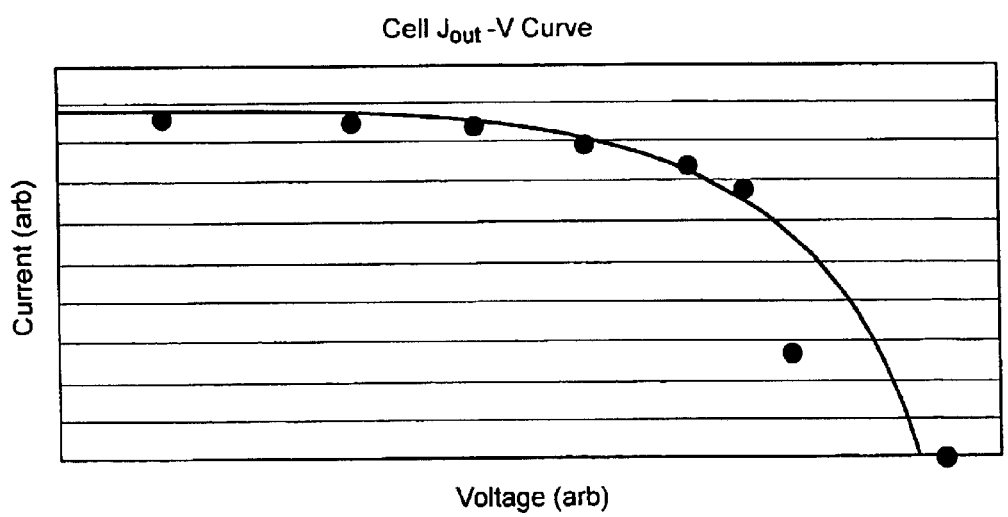
FIG. 6 is a current-voltage plot derived from the data presented in FIG. 5 herein.

FIG. 5 shows a plot of the plateau value of the output voltage $V_O$ as a function of light intensity for the device and conditions of this experiment. Results are presented in both linear and logarithmic coordinates. The plateau value of the output voltage $V_O$ is given by the vertical axis and is labeled as "PVCD Amplitude" where PVCD stands for photovoltaic capacitive diagnostic. The light source intensity is given by the horizontal axis and is labeled "Photodetector Amplitude" to reflect the fact that the intensity was measured with a photodetector. FIG. 5 shows that the plateau value of the output voltage $V_O$ initially increases sharply with increasing light source intensity and increases less gradually as the light source intensity continues to increase, One obtains the expected voltage proportional to logarithm of current relationship. When the data of FIG. 5 is converted to current-voltage format, FIG. 6 results. The fill factor obtained from FIG. 6 is 0.66.

EXPERIMENT 4

The purpose of this experiment is to demonstrate the ability of the diagnostic device of the present invention to provide on-line determinations of performance parameters of photovoltaic devices situated on a moving web in a manufacturing environment. In this experiment, multiple material layers needed to produce a particular type of photovoltaic device were continuously deposited on a moving web and evaluated using the diagnostic device of the present invention. The web had dimensions of typically 600 m (2000 ft)×14 inches wide. The data of this experiment was taken from a production machine. All of the photovoltaic material should be the same, but uncontrolled changes in process parameters lead to variations in the photovoltaic material properties and contained a plurality of photovoltaic devices. Each photovoltaic device was a triple cell device.

The photovoltaic devices were evaluated on-line with the non-contacting diagnostic device of the present invention to obtain waveform data that was subsequently analyzed off-line to determine the open circuit voltage $V_{oc}$, short circuit current $J_{sc}$, shunt resistance $R_s$, fill factor FF, and maximum power $P_{max}$ of the photovoltaic devices probed. The non-contacting diagnostic device described in EXPERIMENT 1 hereinabove was used in this experiment. An improved ultra-high vacuum compatible system was installed in the production machine for these experiments. This PVCD used a pulsed diode light source that allows us to vary the intensity of the light from about 0.01 to 100 mW/cm$^2$, and had diodes that emitted different light wavelengths (infrared, red, amber and blue). The different wavelengths could be pulsed separately or in combinations. The improved 16-bit data acquisition system made approximately 30 unique (different light levels, wavelengths, etc.) measurements during an approximately 5 minute period. Waveform determinations were made at multiple points along the web as it was moving to test multiple photovoltaic devices. The positions along the web at which the waveform determinations were made were carefully recorded so that off-line determinations of the waveforms could be made at the same positions using the contacting device of the prior art as described in EXPERIMENT 1 hereinabove. The offline measurements were made using the production offline QA/QC systems to measure open circuit voltage, short circuit current, fill factor, voltage at maximum power, maximum power, and series and shunt resistance. In this way, the on-line performance of the non-contacting device could be directly compared to the contacting device of the prior art. In this experiment, comparisons of the values of the open circuit voltage $V_{oc}$, short circuit current $J_{sc}$, shunt resistance $R_s$, fill factor FF, and maximum power $P_{max}$ of the photovoltaic devices probed were made.

Figure 7:
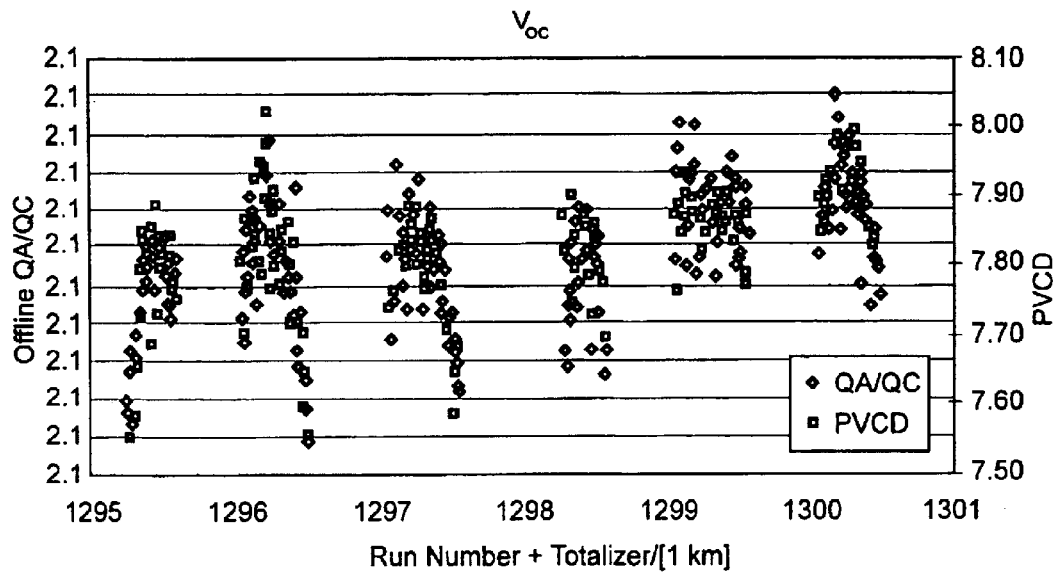
FIG. 7 is a comparison of open circuit voltage measurements obtained from one embodiment of the non-contacting diagnostic device of the present invention and a contacting device of the prior art for a representative photovoltaic device.

FIG. 7 shows open circuit voltages at several positions along the web. The abscissa distinguishes different positions along the web. The values correspond to different relative positions and serve to label different experimental trials. Open circuit voltages determined from waveform data obtained on-line from a moving web using the non-contacting device of the present invention are compared to open circuit voltages obtained off-line at the same positions from the same web in a stationary state using the contacting device of the prior art. Open circuit voltages obtained from on-line data are represented as squares and correspond to the ordinate labeled "PVCD" on the right side of FIG. 7. (Note that the scale is arbitrary; based upon these data, however, we can perform an absolute calibration). Open circuit voltages obtained off-line are represented as diamonds and correspond to the ordinate labeled "Offline QA/QC" on the left side of FIG. 7. The numerical scales of the two ordinates of FIG. 7 differ because the two systems have not yet been calibrated against one another. In practice, a calibration would be made to bring the on-line and off-line data into conformity with each other.

Figure 8:
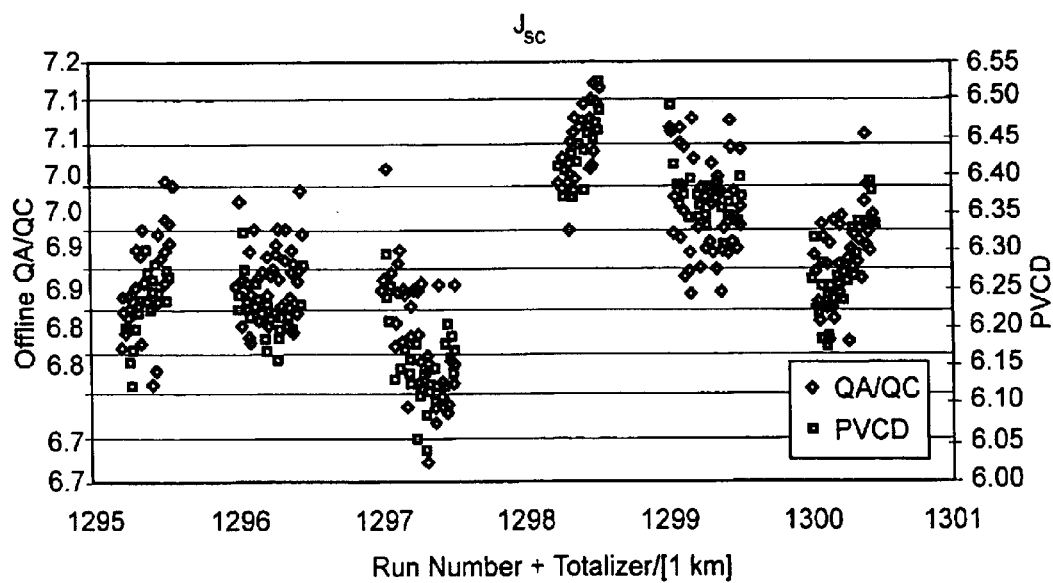
FIG. 8 is a comparison of short circuit current measurements obtained from one embodiment of the non-contacting diagnostic device of the present invention and a contacting device of the prior art for a representative photovoltaic device.

The important result contained in FIG. 7 is the similarity in the open circuit voltages obtained from the non-contacting and contacting devices. The results are identical to within the limits of uncertainty of the respective measurement techniques. FIG. 8 shows a similar result for the short circuit current $J_{sc}$ obtained from the same data used to obtain the open circuit voltages of FIG. 7. The shunt resistance $R_s$, maximum device power $P_{max}$ and fill factor FF were also obtained from the same data used to obtain the open circuit voltage and short circuit current results shown in FIGS. 7 and 8, respectively. Excellent agreement was obtained between the on-line and off-line results for these parameters as well.

The results of this experiment show that the open circuit voltage $V_{oc}$, short circuit current $J_{sc}$, shunt resistance $R_s$, fill factor FF, and maximum power $P_{max}$ of photovoltaic devices can be accurately probed on-line using the non-contacting diagnostic device of the present invention.

The foregoing examples and experiments are intended to be illustrations of, rather than limitations on the practice of the present invention. The present invention is useful for evaluating performance parameters of photovoltaic devices. The advantages of the present invention include the ability to remotely probe photovoltaic devices. The non-contacting nature of the device of the present invention permits the on-line evaluation of photovoltaic devices during continuous manufacturing processes. As a result, it becomes possible to obtain information needed for quality control during device manufacture rather than after the fact on finished devices. The on-line evaluation capability provides fast feedback of photovoltaic device performance, rapid troubleshooting, and permits real-time adjustment of process parameters to remedy deficiencies or tailor the properties of photovoltaic devices.

Although the experiments described hereinabove have focused on n-i-p layered photovoltaic device structures comprised of silicon, it is readily evident that the present invention is applicable to electronic devices and materials in general. The non-contacting device of the present invention operates on the principle of capacitive communication between a photovoltaic device or material and a sensing electrode and requires only that it be possible to induce a time-varying electric field or voltage in the electronic device or material under evaluation. In the embodiments described hereinabove, a time varying electric field or voltage is induced through the absorption of photons provided by a pulsed light source. By varying the wavelength of the pulsed light source, it is possible to induce absorption and a time-varying electric field or voltage in a wide variety of electronic materials and devices.

The pulsed light source of the non-contacting device of the present invention may be a pulsed laser, a pulsed LED, a pulsed non-laser light source or a continuous laser or non-laser light source coupled to an external intensity modulator such as a chopper, shutter, acousto-optical modulator or the like that modulates the intensity of a continuous light source in a periodic or non-periodic manner. To simplify analysis, the turn on and turn off times of the pulsed light source are preferably short in comparison to the risetime and falltime of the photovoltaic device under evaluation. Any light source, however, capable of inducing a time dependent voltage or electric field in the photovoltaic device under evaluation falls within the scope of the present invention because it is possible through waveform deconvolution methods to resolve the effects of the light source from electrical effects induced in the photovoltaic device under evaluation.

The use of a plurality of pulsed light sources operating at the same or different wavelengths with the same or different pulse characteristics also falls within the scope of the present invention. A plurality of pulsed light sources permits the probing of different photovoltaic devices with different absorption characteristics or different layers within a photovoltaic device that have different absorption characteristics. The present invention also extends to combinations of at least one pulsed light source and one or more non-pulsed light sources.

The receiving element of the present invention may be an electrode or conductive material, including a conductive grid alone or embedded in a matrix. The receiving element of the non-contacting device of the present invention may be transparent, as was the case in the experiments described hereinabove, or non-transparent. Transparent receiving elements include transparent conducting oxides and related compounds that transmit the wavelengths of light produced by the pulsed light source. Transparent receiving elements may be located between the pulsed light source and the photovoltaic device under evaluation. Non-transparent receiving elements such as metals do not transmit the light produced by the pulsed light source and must be located in such a way that they do not block the pulsed light source. One possible configuration is to locate non-transparent receiving elements to the photovoltaic device under evaluation and to direct the pulsed light source at a suitable angle relative to the photovoltaic device so that it reaches the surface of the photovoltaic device without being blocked by the electrodes. The receiving element is preferably located parallel to and in close proximity to the photovoltaic device or material under evaluation to improve sensitivity. The receiving element may, however, be positioned at a distance from or at an angle relative to the photovoltaic material or device. The detection circuit, calibration and data analysis procedures can be adjusted to accommodate for the position, size, orientation and other features of the receiving element The form of the receiving element may be pure materials, alloys, mixtures or the like. Sufficiently conductive combinations of conducting and non-conducting materials are also suitable. Also suitable are patterned electrodes such as those in which an electrode material is deposited in the form of a thin film or wires or grid on a substrate or those in which an electrode in the form of a thin film or wire or grid is incorporated within a substrate or other support material.

The detection circuit of the present invention is a circuit in electrical communication with the receiving element that is capable of producing an output electrical signal in response to the electric effect that develops in the receiving element. The output electrical signal may be a voltage, a resistance, a capacitance, an inductance or the like, or any combination thereof. The detection circuit may include resistors, capacitors, inductors, photocells, diodes, amplifiers or other components or combinations thereof. In addition, grounded detection circuits obviate the need for a grounded electrode and permit embodiments of the present invention which do not include a grounded electrode. By way of illustrative example, the grounded electrode of the embodiment depicted in FIG. 1 and described in EXPERIMENTS 1, 2, 3, and 4 hereinabove may be removed if the negative terminal of the operational amplifier in the detection circuit is connected to ground.

The detection circuit may include virtually any input impedance and any RC time constant. The RC time constant of the detection circuit may distort the output signal. However, provided one knows and keeps constant the detection circuit time constant, this distortion can be corrected for by electronics or data analysis procedures.

While the invention has been illustrated in detail in the drawings and the foregoing description, the same is to be considered as illustrative and not restrictive in character, it is understood that only the preferred embodiments have been shown and described fully and that all changes and modifications that come within the spirit of the invention are desired to be protected.

We claim:

1. An apparatus comprising:
   a moving substrate, said substrate having a material or device formed thereon and a non-contacting diagnostic device, said diagnostic device providing one or more properties of said material or device formed on said substrate, said diagnostic device providing said one or more properties while said substrate is in motion, said diagnostic device comprising:
   a pulsed light source directing energy into said material or device formed on said substrate, said material or device formed on said substrate generating an electric field in response to said energy; and
   a sensing circuit providing an output signal in response to said electric field, said output signal providing data for determining said one or more properties provided by said diagnostic device.

2. The apparatus of claim 1, wherein said material or device formed on said substrate comprises silicon.

3. The apparatus of claim 2, wherein said silicon is n-type silicon.

4. The apparatus of claim 2, wherein said silicon is p-type silicon.

5. The apparatus of claim 1, wherein said material or device formed on said substrate is a photovoltaic device.

6. The apparatus of claim 1, wherein said material or device formed on said substrate is a multi-layer device.

7. The apparatus of claim 1, wherein said one or more properties provided by said diagnostic device include the open circuit voltage or short circuit current of said material or device formed on said substrate.

8. The apparatus of claim 1, wherein said one or more properties provided by said diagnostic device include the current-voltage relationship of said material or device farmed on said substrate.

9. The apparatus of claim 1, wherein said pulsed light source includes a continuous light source and an intensity modulator.

10. The apparatus of claim 1, wherein said pulsed light source includes a laser.

11. The apparatus of claim 1, wherein said pulsed light source includes a light emitting diode.

12. The apparatus of claim 1, further comprising one or more additional light sources.

13. The apparatus of claim 12, wherein said pulsed light source and said one or more additional light sources provide light at two or more wavelengths.

14. The apparatus of claim 12, wherein at least one of said one or more additional light sources is a continuous light source.

15. The apparatus of claim 1, wherein said energy directed by said pulsed light source is absorbed by said material or device, said absorption providing said electric field.

16. The apparatus of claim 1, wherein said sensing circuit comprises a receiving element, said receiving element receiving as input said electric field, said receiving.

17. The apparatus of claim 16, wherein said receiving element is transparent.

18. The apparatus of claim 16, wherein said receiving element comprises a transparent conducting oxide.

19. The apparatus of claim 18, wherein said transparent conducting oxide comprises indium or tin.

20. The apparatus of claim 16, wherein said receiving element comprises a conductive grid.

21. The apparatus of claim 20, wherein said conductive grid is supported by or within a non-conductive substrate.

22. The apparatus of claim 1, wherein said one or more properties provided by said diagnostic device are provided substantially in real time.

23. The apparatus of claim 1, wherein said non-contacting diagnostic device provides on-line monitoring of a semiconductor device or material in a continuous manufacturing process.

24. The apparatus of claim 23, wherein said on-line monitoring permits real-time adjustment of a process parameter of said continuous manufacturing process.

* * * * *